United States Patent  
Xu et al.

(10) Patent No.: US 7,401,403 B2  
(45) Date of Patent: Jul. 22, 2008

(54) METHOD FOR FORMING CERAMIC THICK FILM ELEMENT ARRAYS WITH FINE FEATURE SIZE, HIGH-PRECISION DEFINITION, AND/OR HIGH ASPECT RATIOS

(75) Inventors: Baomin Xu, Cupertino, CA (US); Stephen D. White, Santa Clara, CA (US); Steven A. Buhler, Sunnyvale, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 422 days.

(21) Appl. No.: 11/017,569

(22) Filed: Dec. 20, 2004

(65) Prior Publication Data

US 2006/0130302 A1   Jun. 22, 2006

(51) Int. Cl.  
*H05K 3/02* (2006.01)  
*B28B 3/06* (2006.01)

(52) U.S. Cl. .................................. 29/846; 264/297.6

(58) Field of Classification Search ................ 29/25.35, 29/846, 843, 851, 855, 856; 264/297.1, 297.6, 264/317, 219, 299, 430; 205/67, 70  
See application file for complete search history.

(56) References Cited

U.S. PATENT DOCUMENTS

| | | | | |
|---|---|---|---|---|
| 5,676,906 A | * | 10/1997 | Hirata | 264/430 |
| 6,113,836 A | * | 9/2000 | Sakai et al. | 264/400 |
| 6,375,880 B1 | * | 4/2002 | Cooper et al. | 264/138 |
| 6,605,293 B1 | * | 8/2003 | Giordano et al. | 424/423 |
| 6,669,801 B2 | * | 12/2003 | Yoshimura et al. | 156/230 |
| 2002/0066524 A1 | | 6/2002 | Kagawa et al. | |
| 2002/0066525 A1 | | 6/2002 | Wada et al. | |

2004/0164650 A1   8/2004   Xu et al.

FOREIGN PATENT DOCUMENTS

EP   1 453 103 A2   9/2004

OTHER PUBLICATIONS

Partial European Search Report  
Victor F. Janas and Ahmad Safari, "Overview of Fine-Scale Piezoelectric Ceramic/Polymer Composite Processing", J. Am. Ceram. Soc., 78 [11], 2945-55 (1995).  
R. K. Panda, V. F. Janas and A. Safari, "Fabrication and Properties of Fine Scale 1-3 Piezocomposites by Modified Lost Mold Method", Proceedings of the Tenth IEEE International Symposium on Applications of Ferroelectrics, 551-554 (1996).  
S. Stark, A. Schonecker and W. Gebhardt, "Fine Scale Piezoelectric 1-3 Composites: A New Approach of Cost Effective Fabrication", Proceedings of the Eleventh IEEE International Symposium on Applications of Ferroelectrics, 393-396 (1998).

(Continued)

*Primary Examiner*—A. Dexter Tugbang  
*Assistant Examiner*—Tai Nguyen  
(74) *Attorney, Agent, or Firm*—Fay Sharpe LLP (57) ABSTRACT

A method is provided that includes providing a mold on a temporary substrate, e.g., a sapphire substrate. Next, a material such as PZT paste is deposited into the mold. Then, the mold is removed to obtain elements formed by the mold. The formed elements will then be sintered. After sintering, electrode deposition is optionally performed. The sintered elements are then bonded to a final target substrate and released from the temporary substrate through laser liftoff. Further, electrodes may also be optionally deposited at this point.

30 Claims, 5 Drawing Sheets

OTHER PUBLICATIONS

S. Gebhardt and A. Schonecker, "Fine Scale Piezoelectric 1-3 Composites by Soft-Molding", Materials Mechanics, Fracture Mechanics, Micro Mechanics, www.ikts.fhg.de, 5 pages (Preprint 1999).

Sylvia Gabhardt, Andreas Schonecker, Ralf Steinhausen, Tilo Hauke, Wolfgang Seifert and Horst Beige, "Fine Scale 1-3 Composites Fabricated by the Soft Mold Process: Preparation and Modeling", Ferroelectrics, vol. 241, 67-73 (2000).

S. Gebhardt, A. Schonecker, R. Steinhausen, W. Seifert, H. Beige, "Quasistatic and Dynamic Properties of 1-3 Composites Made by Soft Molding", J. European Ceram. Soc., 23, 153-159 (2003).

Nobuyuki Futai, Kiyoshi Matsumoto and Isao Shimoyama, "Fabrication of High-Aspect-Ratio PZT Thick Film Structure using Sol-Gel Technique and Su-8 Photoresist", The Institute of Electrical and Electronic Engineers, 168-171 (2002).

* cited by examiner

METHOD FOR FORMING CERAMIC THICK FILM ELEMENT ARRAYS WITH FINE FEATURE SIZE, HIGH-PRECISION DEFINITION, AND/OR HIGH ASPECT RATIOS

BACKGROUND

The present exemplary embodiments relate to a method for forming ceramic (e.g., piezoelectric such as lead zirconate titanate (PZT)) thick film element arrays with fine feature size, high-precision definition, and/or high aspect ratios. It finds particular application in conjunction with high frequency and/or ultrasonic implementations, and will be described with particular reference thereto. However, it is to be appreciated that the present exemplary embodiment is also amenable to other like applications.

Figure 1:
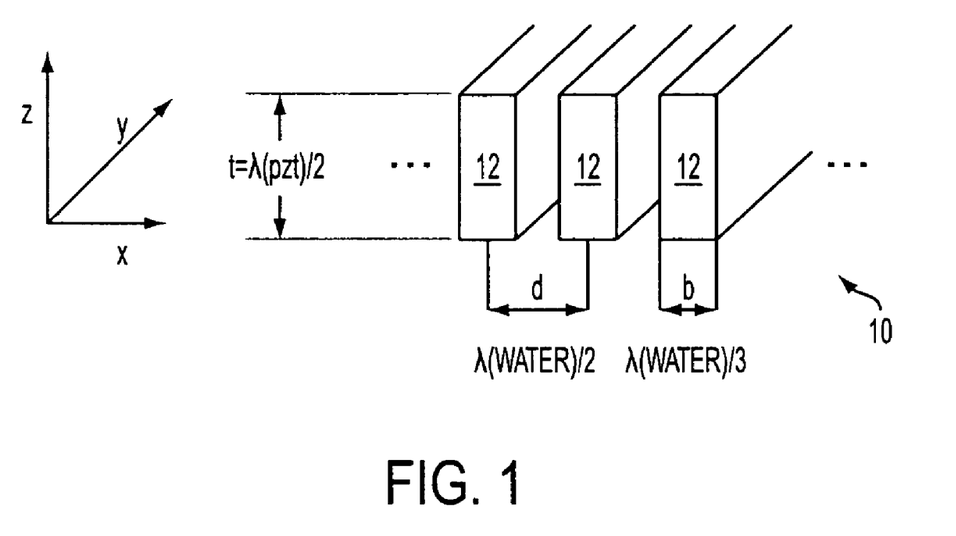
FIG. 1 is an illustration of an array of high aspect ratio elements.

Ceramic thick films, especially piezoelectric thick film (thickness between 10 to 100 μm) element arrays with fine feature size, high-precision definition, and/or high aspect ratios have many applications in, for example, micro electromechanical systems (MEMS) devices, nondestructive testing and medical imaging. For example, as shown in FIG. 1, a one-dimensional (1-D) piezoelectric element array 10 for medical ultrasound imaging may comprise a plurality of high-aspect elements 12. To operate the piezoelectric element array 10 at the desired resonant frequency, i.e., that of the longitudinal mode, to obtain maximum acoustic power output, the thickness t of the piezoelectric elements should be approximately $\lambda_{PZT}/2$, where $\lambda_{PZT}$ is the acoustic wavelength in PZT ceramics. As the sound velocity of PZT ceramics is about 4000 M/s and a typical frequency used in the present technology is 40 MHz, the thickness of the PZT elements should be approximately 50 μm. On the other hand, in order to reduce the side lobe of the waveform, the center-to-center distance d of the PZT elements should be about half of the acoustic wavelength in human organs, which is close to that of water. This results in the lateral dimension b of the PZT elements being approximately $\lambda_{water}/3$. Considering $\lambda_{PZT} \approx (4/1.5)\lambda_{water}$, the height-to-width aspect ratio of the PZT elements should be at least $(4/1.5)/2/(1/3)=4$. Thus, for the 50 μm-thick PZT films, the lateral dimension b should be about 12.5 μm, and the spacing between the elements should be about 6.25 μm.

At present, there is a need for cost effective methods to directly form piezoelectric elements with a thickness between 10 to 100 μm, such as 50 μm. Moreover, there is a need for effective methods for forming arrays of elements with a high aspect ratio, as described above, in such a thickness range. Attempts to satisfy these needs are outlined below.

A method has been proposed for producing high aspect ratio PZT thick film elements by combining a sol-gel technique with SU-8 molding. N. Futai, K. Matsumoto, I. Shimoyama, "Fabrication of High-Aspect-Ratio PZT Thick Film Structure Using Sol-Gel Technique and SU-8 Photoresist," Technical Digest of MEMS 2002 *IEEE International Conference*, pp. 168-171 (2002). However, there is quite a large portion of organics in the sol-gel derived PZT elements, which needs to be burned out during sintering or annealing. This leads to the difficulty of densifying high-aspect-ratio sol-gel PZT films made by using a SU-8 mold, and thus affects the quality of the films. Second, due to the limited doping effect in the sol-gel films, the properties of the sol-gel derived PZT films cannot be easily tailored. That is, it is very difficult to make sol-gel PZT films to be intentionally soft or hard. Third, the sol-gel derived PZT films need to be annealed at 600° C. or higher, so the choice of the substrates is limited.

Others have proposed making 1-3 PZT/epoxy composites using soft molds and slip casting. S. Gebhardt et al., "Fine Scale Piezoelectric 1-3 Composites by Soft Mold Process: Preparation and Modeling," *Ferroelectrics*, v. 241, pp. 67-73 (2000). However, it is difficult to use these methods for elements having a very fine feature size, such as less than 10 μm in the lateral dimension or in spacing.

In U.S. Pat. No. 7,089,635 B2, bearing application Ser. No. 10/376,544, and Publication No. 2004/0164650 A1, filed on Feb. 25, 2003, entitled "Methods to Make Piezoelectric Ceramic Thick Film Array and Single Element and Devices," and naming Baomin Xu et al as inventors, a technique combining screen printing and laser liftoff has been proposed to make high quality piezoelectric ceramic element arrays on almost any kind of substrate. This method can provide high quality PZT elements because the PZT elements are sintered on a sapphire substrate and, thus, there is no limitation on sintering conditions. Also, for the final target substrate, this is a low-temperature and clean process because the PZT elements are transferred to the final target substrate after sintering. The cost of this method is also much lower than sol-gel processing because it uses conventional bulk raw materials and the sapphire substrate can be re-used.

In U.S. Pat. No. 7,070,668 B1, bearing application Ser. No. 11/017,325, filed Dec. 20, 2004 now U.S. Pat. No. 7,070,669, entitled "A Method for Forming Ceramic Thick Film Element Arrays," and naming Baomin Xu and Stephen David White, an alternative transfer technique has been proposed. That is, the printing substrate is advantageously provided with a release layer, and making it possible to release the printed and soft-baked ceramic elements from the printing substrate and transfer them to the sintering substrate. After sintering, the ceramic elements are transferred to the final target substrate.

However, there are several qualities of some screen printing methods that do not render them particularly advantageous when applied to high aspect ratio and/or very fine feature size implementations. First, it is difficult to make high thickness-to-width aspect ratio elements. Second, the smallest feature size and spacing for screen printing is about 50 μm, but many MEMS devices may require piezoelectric elements with dimensions smaller than 50 μm. Third, the edge of screen printed elements is not very sharp and there is typically a transition area along the edge.

BRIEF DESCRIPTION

In accordance with one aspect of the present exemplary embodiment, a method comprises depositing ceramic material into a mold disposed on a temporary substrate, removing the mold to obtain molded elements comprising the material, sintering the molded elements, bonding the molded elements to a target substrate and removing the temporary substrate.

In another aspect of the presently described exemplary embodiments, the method further comprises forming the mold of SU-8 or other suitable photoresist material.

In another aspect of the presently described exemplary embodiments, the method further comprises depositing electrodes on the molded elements;

In another aspect of the presently described exemplary embodiments, depositing the ceramic material comprises screen printing ceramic material into recesses of the mold.

In another aspect of the presently described exemplary embodiments, depositing the ceramic material comprises depositing a paste of ceramic material into the mold by a casting or a wiping process.

In another aspect of the presently described exemplary embodiments, the depositing of the ceramic material comprises use of an electrophoretic or gravity technique.

In another aspect of the presently described exemplary embodiments, removing of the mold comprises removing the mold by laser ablation through a mask.

In another aspect of the presently described exemplary embodiments, the removing of the mold comprises exposing the mold to a relatively high temperature in an open environment.

In another aspect of the presently described exemplary embodiments, the sintering is performed in a controlled environment having, for example, a lead-rich atmosphere.

In another aspect of the presently described exemplary embodiments, the sintering is performed at 600° C. to 1500° C., and more preferably, at 1100° C. to 1350° C.

In another aspect of the presently described exemplary embodiments, the ceramic material is prepared as a paste.

In another aspect of the presently described exemplary embodiments, the ceramic material is lead zirconate titanate (PZT) material.

In another aspect of the presently described exemplary embodiments, the temporary substrate is sapphire, zirconia, strontium titanate, or other suitable materials.

In another aspect of the presently described exemplary embodiments, a method comprises forming a mold on a temporary substrate, depositing piezoelectric material into the mold, removing the mold to obtain molded piezoelectric elements comprising the piezoelectric material, sintering the piezoelectric elements, depositing first electrodes on the piezoelectric elements, bonding the piezoelectric elements to a target substrate, removing the temporary substrate and depositing second electrodes on the piezoelectric elements.

In another aspect of the presently described exemplary embodiments, the mold is formed of SU-8 or other suitable photoresist material.

In another aspect of the presently described exemplary embodiments, depositing the piezoelectric material comprises screen printing the piezoelectric material into recesses of the mold followed by a drying or soft baking process.

In another aspect of the presently described exemplary embodiments, the depositing of the piezoelectric material comprises depositing a paste of the piezoelectric material into the mold by a casting or a wiping process, followed by a drying or soft baking process.

In another aspect of the presently described exemplary embodiments, the removing of the mold comprises removing the mold by laser ablation through a mask.

In another aspect of the presently described exemplary embodiments, the removing of the mold comprises exposing the mold to a relatively high temperature in an open environment.

In another aspect of the presently described exemplary embodiments, the sintering is performed in a controlled environment in a lead-rich atmosphere.

In another aspect of the presently described exemplary embodiments, the sintering is performed at 600° C. to 1500° C., and more preferably at 1100° C. to 1350° C.

In another aspect of the presently described exemplary embodiments, the piezoelectric material is prepared as a paste.

In another aspect of the presently described exemplary embodiments, the piezoelectric material is lead zirconate titanate (PZT) material.

In another aspect of the presently described exemplary embodiments, the temporary substrate is sapphire, zirconia, strontium titanate, or other suitable materials.

In another aspect of the presently described exemplary embodiments, the depositing of the ceramic material comprises use of an electrophoretic or gravity technique.

In another aspect of the presently described exemplary embodiments, laser lift-off techniques are used to remove the temporary substrate.

In another aspect of the presently described exemplary embodiments, soft-polishing techniques are implemented after drying or soft baking.

DETAILED DESCRIPTION

According to the presently described embodiments, techniques of screen printing or other deposition methods, molding, and laser liftoff are combined to advantageously form piezoelectric thick film elements with fine feature size, high-precision definition, and/or high aspect ratios. The overall method may be implemented in a number of different manners or embodiments using a variety of fabrication, hardware and/or software techniques. The techniques described may also vary as a function of whether the manufactured products are produced at high speed, in mass, or are custom formed.

Figure 2:
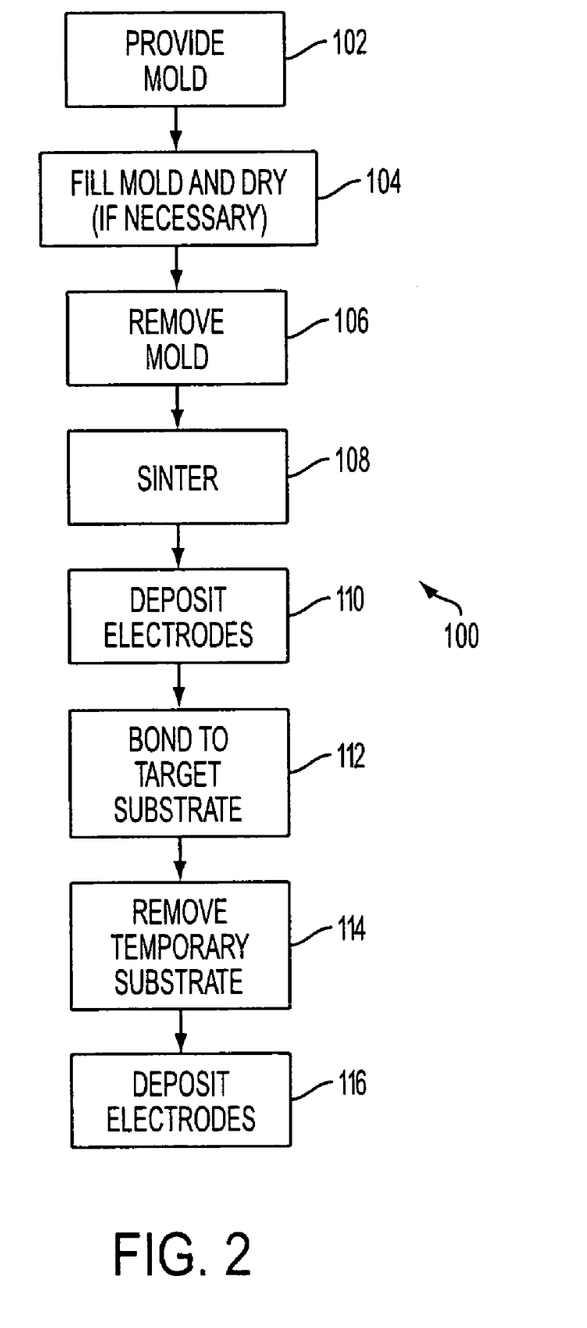
FIG. 2 is a flow chart illustrating an overall method of the presently described embodiments.

With reference now to FIG. 2, a method 100 is illustrated. The method includes providing a mold on a temporary substrate, e.g., a sapphire substrate or substrate of another refractory material (at 102). An illustrative process for doing so will be described below; however, any of a variety of methods of mold forming may be used. Also, in at least one form, SU-8 material is used to form the mold. Other photoresist material may also be used. Next, a material such as PZT paste or other ceramic material is deposited into the mold (e.g., the recesses of the mold) which is disposed on the temporary substrate (at 104), followed by a drying or soft baking process if necessary. Then, the mold is removed to obtain elements formed by the molds (at 106). In one form, these elements will then be heated to certain temperatures in an oxidizing environment (of which air is sufficiently oxidizing) to burn out the mold. The mold can also be removed by using laser ablation or other dry methods. Laser ablation may be conducted through a mask, if necessary. Next, the formed elements will be sintered at high temperatures and, in one form, in a controlled environment with Pb-rich atmosphere (at 108). After sintering, electrode deposition is optionally performed on the elements (at 110). The sintered elements are then bonded to a final target substrate (at 112) and released from the temporary substrate through, for example, laser liftoff (at 114). Further, electrodes may also be optionally deposited at this point (at 116).

As noted, the presently described embodiments combine screen printing or other deposition methods, molding such as SU-8 molding, and laser liftoff to form piezoelectric elements with fine feature size (e.g., as small as several μm in scale), high precision definition (e.g., having very sharp edges), and/or a high aspect ratio (e.g., having a thickness to width ratio larger than 2:1, and more preferably, larger than 4:1). For example, the presently described embodiments as implemented may result in elements having lateral dimensions of 5 micrometers (μm) to 5 millimeters (mm), height or thickness of 10 micrometers (μm) to 500 micrometers (μm), and spacing between elements of 1 micrometer (μm) to 100 micrometers (μm). One illustrative technique according to the presently described embodiments reflecting the method described in connection with FIG. 2 is shown in more detail in FIGS. 3-9.

Figure 3:
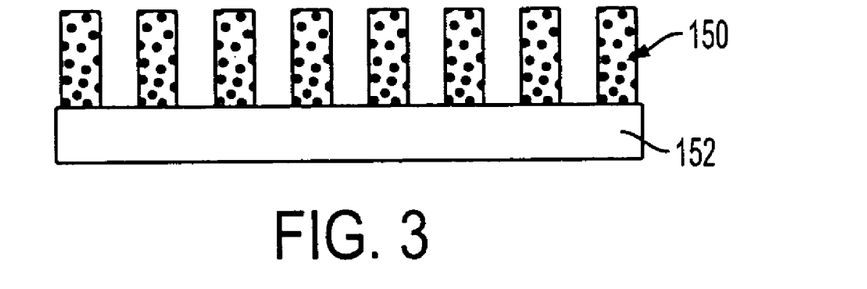
FIG. 3 is an illustration of a portion of a method according to the presently described embodiments.

First, with reference to FIG. 3, a mold 150 is made on a substrate 152. In one form, the mold is formed (e.g., screen printed, spun, etc. to obtain uniform thickness) from SU-8 material, and the substrate is, in one form, formed from material that can withstand high temperatures such as sapphire. The mold 150 can be formed with a height-to-width ratio up to twenty (20), a very sharp edge, and an opening of only a few μm. It is expected that this method will allow making PZT element arrays with higher than 4:1 aspect ratio, high precision definition on the edge, and feature size at the μm scale. Of course, the dimensions and shapes may be varied. This variance between elements may even be present within a single array. Moreover, the material of both the mold and substrate may be changed as a function of the design objectives and the implementation. For example, other transparent materials, such as transparent alumina ceramic, yttria-stabilized zirconia, strontium titanate, may be used for the substrate, for example, where laser lift-off is used.

Figure 4:
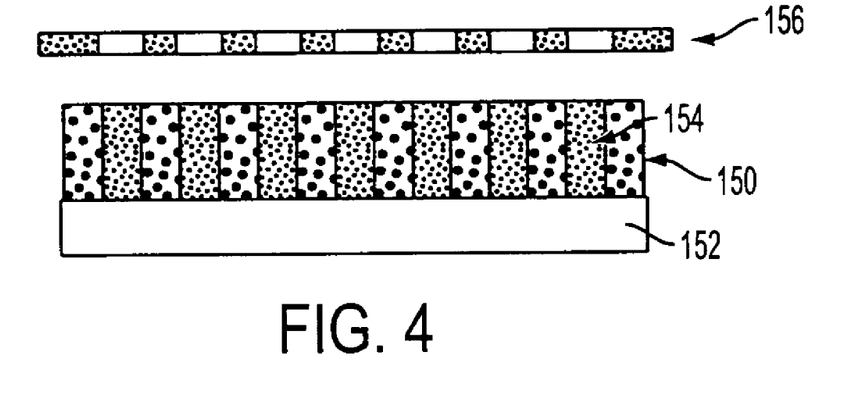
FIG. 4 is an illustration of a portion of a method according to the presently described embodiments.

Then, with reference to FIG. 4, a material such as piezoelectric material 154 is deposited into the mold. The selected material may be lead zirconate titanate (PZT) and may take the form of paste, although other compositions and consistencies may be used. One method to deposit the material is to screen print the paste into the mold using a screen 156. Multiple passes of the screen printing mechanism may be used to deposit multiple layers of material. It should be understood that if the mold is only used to improve the edge definition of the PZT elements, i.e., the aspect ratio is not high, a slurry of material such as PZT paste can be printed into the openings of the mold using conventional screen printing methods. The air in the openings can be easily removed in this case. However, if the aspect ratio is high, other techniques for depositing may be more efficient.

In this regard, if either or both the lateral dimensions of the array elements are expected to be small and the thickness-to-width aspect ratios are expected to be high, the screen printing of PZT paste, for example, may be accomplished in a vacuum. The rheologic properties of the paste and solvent concentration will not change significantly in this environment. Thus, it is possible to screen print the PZT paste in a vacuum.

A slurry of material such as PZT paste can also be deposited into the mold by a casting or wiping process. Of course, the screen 156 would not be necessary in this case. This may also be accomplished in a vacuum. Soft baking or drying should follow these deposition steps. Using any of these techniques (including screen printing), soft polishing may be used to level the surface. As with screen printing, multiple iterations may be used to deposit the material. So, a cycle of casting or wiping and/or soft baking or drying may be used to achieve a desired thickness of deposit. Of course, other techniques may also be implemented.

For example, another method for depositing material such as PZT material into a deep hole is to use an electrophoretic method. The powder such as PZT powder is prepared as a colloidal dispersion by using a method such as spray coating of a binder and charge control agent and using typical colloidal dispersion preparation techniques (e.g., Isopar—like liquid toner). In this case, referring to FIG. 5, dispersed particles from the colloidal suspension 160 are deposited in the openings of a mold 150, as shown at 162. In order to do this, an electrode 164 is positioned against the backside surface of the sapphire substrate 152 so that voltages from a voltage source 168 can be applied. An insulator 166 is also provided for improved performance. Excess material such as PZT material on the surface is then simply polished or wiped away. It should also be understood that electrophoretic deposition does not require a liquid. For instance, powder coating through air would also work. Regardless of whether or not a solvent is used, the voltage source for deposition may be alternating current (AC) with asymmetric pulses, in order to provide motion in little steps via the displacement charge through the sapphire, or in combination with direct current (DC) voltage.

Figure 5:
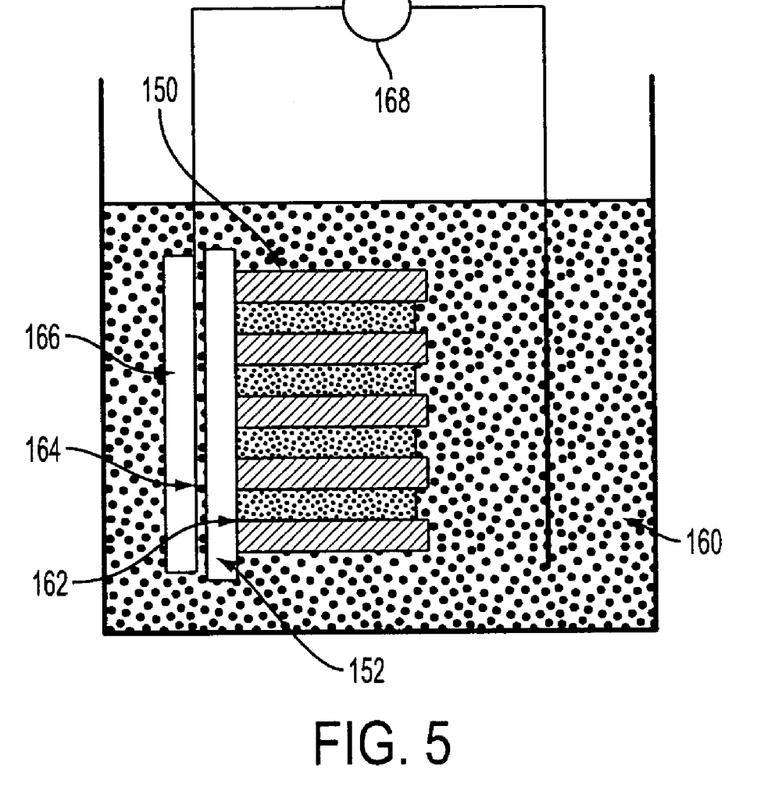
FIG. 5 is an illustration of an alternative approach to the portion of the method of FIG. 4 portion.

Still another method for depositing the PZT material into deep holes is to use a dispersion (e.g., diluted paste) of material such as PZT material with appropriate solvent and a binder/vehicle. In this case, the dispersed material would be allowed to settle under gravity into the deep holes of the SU-8 mold. Excess PZT on the surface would be polished or wiped away.

Figure 6:
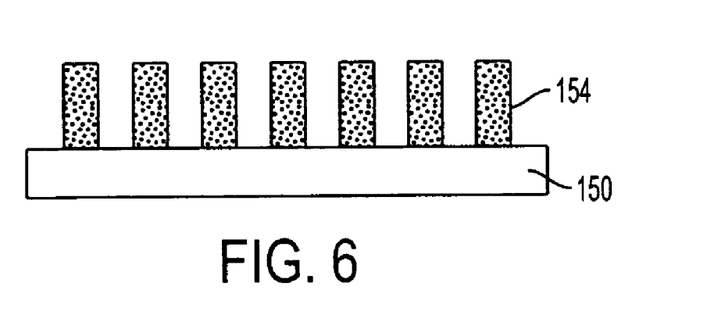
FIG. 6 is an illustration of a portion of a method according to the presently described embodiments.

No matter the method of depositing the material, after soft-baking the PZT or other material paste, with reference to FIG. 6, the mold can be removed by a dry method such as laser ablation, which may be conducted through a mask if necessary. Or, the SU-8 mold can be burned out when heating the sample to relatively high temperature (probably 300 to 600° C.) in an oxidizing environment. Of course, other methods may be used to remove the mold. This leaves the molded array elements 154 disposed on the temporary substrate.

Figure 7:
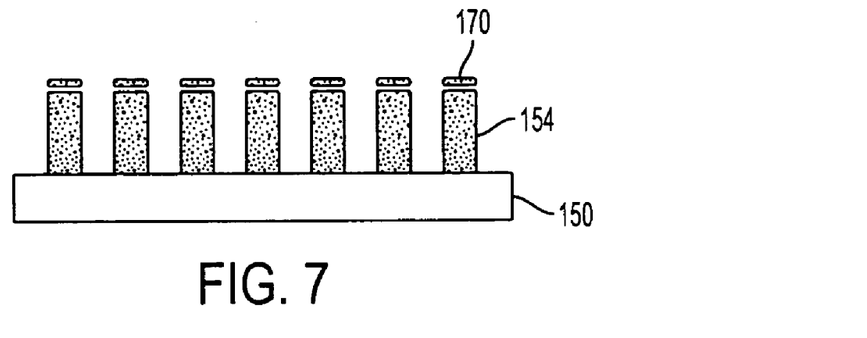
FIG. 7 is an illustration of a portion of a method according to the presently described embodiments.

Next, referring now to FIG. 7, the array elements 154 are sintered at high temperatures (600° C. to 1500° C., more preferably 1100 to 1350° C.) and, in one form, in a controlled environment with lead-rich atmosphere to ensure high density and high quality. After sintering, electrodes 170 may also be deposited on a surface of the molded elements 154. Any suitable electrode deposition process may be used.

Figure 8:
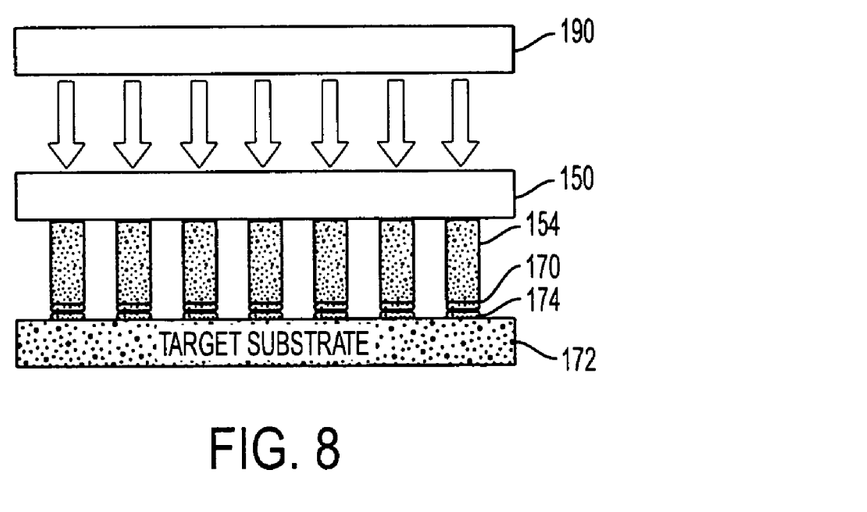
FIG. 8 is an illustration of a portion of a method according to the presently described embodiments; and, FIG. 9 is an illustration of a portion of a method according to the presently described embodiments.
Figure 9:
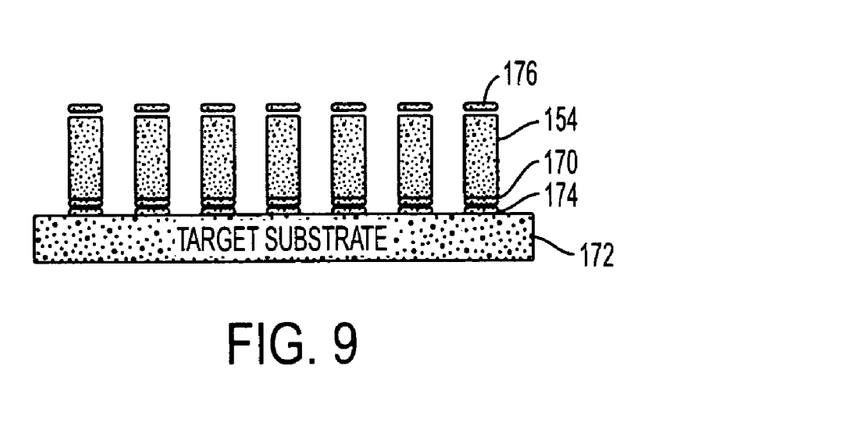

As shown in FIGS. 8 and 9, after sintering and electrode deposition, the array elements 154 are bonded to a final target substrate 172 using adhesive bonds 174. The final target substrate could take any of a number of forms as a function of, for example, the ultimate implementation of the ceramic element arrays. It could be, for example, a suitable ceramic material or a silicon-based material. It should be appreciated that any suitable bonding technique may be used. Then, the array elements will be exposed to an excimer laser 190 and released from the temporary substrate using, for example, a laser lift-off process, as described in the U.S. Pat. No. 7,089,635 B2, bearing application Ser. No. 10/376,544, having Publication No. US2004/0164650 A1, filed Feb. 25, 2003, and bearing the title "Methods to Make Piezoelectric Ceramic Thick Film Array and Single Elements and Devices" (Xu, et al.), which is incorporated herein by reference. Next, the functional array elements are formed on the final target substrate by removing any potential surface damage layer (if necessary) and performing electrode deposition to form electrodes 176 (if necessary).

The proposed method can easily make piezoelectric ceramic thick film arrays or single elements in a thickness range from 10 to 100 μm, with aspect thickness-to-width ratio more than 2:1, and more preferably more than 4:1, and feature size at the μm scale. Other example dimensions are noted above.

As solid-state powders can be used as raw materials and the sapphire substrates can be repeatedly used, this is an inexpensive and effective method to produce thick film arrays and single elements with high precision definition, fine feature size, and/or high aspect ratio. It also produces high quality films, as the sintering temperature is less limited by the substrate.

This is a clean and low temperature process for the final target substrate or system and is fully compatible with integrated circuit processes, if the final system is silicon-based microelectronics. It has been experimentally demonstrated that bonding the piezoelectric films to a silicon wafer and doing the laser liftoff will not cause any damages to the CMOS circuit on the silicon wafer.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications, variations, improvements, and substantial equivalents.

The invention claimed is:

1. A method comprising:
depositing ceramic material into a mold disposed on a temporary substrate;
removing the mold to obtain molded elements comprising the material, wherein the removing of the mold comprises exposing the mold to a relatively high temperature in an oxidizing environment to burn out the mold;
sintering the molded elements;
bonding the molded elements to a target substrate; and,
removing the temporary substrate.

2. The method as set forth in claim 1 further comprising forming the mold of SU-8 or other photoresist material.

3. The method as set forth in claim 1 further comprising depositing electrodes on the molded elements.

4. The method as set forth in claim 1 wherein depositing the ceramic material comprises screen printing ceramic material into recesses of the mold.

5. The method as set forth in claim 1 wherein the depositing of the ceramic material comprises depositing a paste of ceramic material into the mold by a casting or wiping process.

6. The method as set forth in claim 1 wherein the depositing of the ceramic material comprises use of an electrophoretic or gravity technique.

7. The method as set forth in claim 1 wherein the depositing of the ceramic material further comprises soft polishing or wiping to level the surface of the deposited ceramic material.

8. The method as set forth in claim 1 wherein the removing of the mold comprises removing the mold by laser ablation.

9. The method as set forth in claim 1 wherein the sintering is performed at 600° C. to 1500° C.

10. The method as set forth in claim 1 wherein the sintering is performed at 1100° C. to 1350° C.

11. The method as set forth in claim 1 wherein the ceramic material is prepared as a paste.

12. The method as set forth in claim 1 wherein the ceramic material is lead zirconate titanate (PZT) material.

13. The method as set forth in claim 1 wherein the sintering is performed in a controlled environment.

14. The method as set forth in claim 13 wherein the controlled environment is a lead-rich atmosphere.

15. The method as set forth in claim 1 wherein the temporary substrate is sapphire or other suitable refractory material.

16. A method comprising:
depositing ceramic material into a mold disposed on a temporary substrate;
removing the mold to obtain molded elements comprising the material;
sintering the molded elements;
bonding the molded elements to a target substrate; and,
removing the temporary substrate, wherein the removing of the temporary substrate comprises use of laser liftoff technique wherein the ceramic material is exposed to an excimer laser source through the temporary substrate.

17. The method as set forth in claim 16 further comprising forming the mold of SU-8 or other photoresist material.

18. The method as set forth in claim 16 further comprising depositing electrodes on the molded elements.

19. The method as set forth in claim 16 wherein depositing the ceramic material comprises screen printing ceramic material into recesses of the mold.

20. The method as set forth in claim 16 wherein the depositing of the ceramic material comprises depositing a paste of ceramic material into the mold by a casting or wiping process.

21. The method as set forth in claim 16 wherein the depositing of the ceramic material comprises use of an electrophoretic or gravity technique.

22. The method as set forth in claim 16 wherein the depositing of the ceramic material further comprises soft polishing or wiping to level the surface of the deposited ceramic material.

23. The method as set forth in claim 16 wherein the removing of the mold comprises removing the mold by laser ablation.

24. The method as set forth in claim 16 wherein the sintering is performed at 600° C. to 1500° C.

25. The method as set forth in claim 16 wherein the sintering is performed at 1100° C. to 1350° C.

26. The method as set forth in claim 16 wherein the ceramic material is prepared as a paste.

27. The method as set forth in claim 16 wherein the ceramic material is lead zirconate titanate (PZT) material.

28. The method as set forth in claim 16 wherein the sintering is performed in a controlled environment.

29. The method as set forth in claim 28 wherein the controlled environment is a lead-rich atmosphere.

30. The method as set forth in claim 16 wherein the temporary substrate is sapphire or other suitable refractory material.

* * * * *